US005967859A

United States Patent [19]

Cecil, Jr. et al.

[11] Patent Number: 5,967,859

[45] Date of Patent: Oct. 19, 1999

[54] ELECTRICAL CONNECTOR ASSEMBLY WITH TERMINAL RETAINER SYSTEM

[75] Inventors: Paul D. Cecil, Jr.; Anthony J. Pill, both of Aurora, Ill.

[73] Assignee: Molex Incorporated, Lisle, Ill.

[21] Appl. No.: 08/987,817

[22] Filed: Dec. 10, 1997

[51] Int. Cl.[6] .................... H03R 13/514

[52] U.S. Cl. .................... 439/752; 439/595

[58] Field of Search .................... 439/752, 595, 439/598, 599

[56] References Cited

U.S. PATENT DOCUMENTS

| | | | |
|---|---|---|---|
| 4,655,525 | 4/1987 | Hunt, III et al. | 439/599 |
| 4,695,112 | 9/1987 | Maston et al. | 439/350 |
| 4,721,478 | 1/1988 | Sonobe | 439/752 |
| 4,820,198 | 4/1989 | Lulko et al. | 439/595 |
| 4,950,182 | 8/1990 | Zielinski et al. | 439/595 |
| 4,959,023 | 9/1990 | Watanabe et al. | 439/752 |
| 4,971,580 | 11/1990 | Ward et al. | 439/595 |
| 4,984,998 | 1/1991 | Duncan et al. | 439/595 |
| 5,033,980 | 7/1991 | Watanabe et al. | 439/752 |
| 5,044,991 | 9/1991 | Colleran et al. | 439/595 |
| 5,085,599 | 2/1992 | Maejima et al. | 439/598 |
| 5,100,346 | 3/1992 | McCardell | 439/595 |
| 5,108,310 | 4/1992 | Sawada et al. | 439/752 |
| 5,116,236 | 5/1992 | Colleran et al. | 439/271 |
| 5,151,052 | 9/1992 | McCardell | 439/598 |
| 5,186,662 | 2/1993 | Yuasa et al. | 439/752 |
| 5,211,589 | 5/1993 | McCardell | 439/879 |
| 5,224,883 | 7/1993 | Yamamoto | 439/752 |
| 5,281,168 | 1/1994 | Krehbiel et al. | 439/595 |
| 5,295,875 | 3/1994 | McCardell | 439/851 |
| 5,299,958 | 4/1994 | Ohsumi | 439/752 |
| 5,411,421 | 5/1995 | McCardell, Jr. | 439/879 |
| 5,437,565 | 8/1995 | Atsumi et al. | 439/752 |
| 5,454,740 | 10/1995 | Sakano et al. | 439/752 |
| 5,464,356 | 11/1995 | Nebeshima et al. | 439/752 |
| 5,474,477 | 12/1995 | Aoyama | 439/752 |
| 5,595,509 | 1/1997 | Fry et al. | 439/752 |
| 5,653,613 | 8/1997 | Shimoda | 439/752 |

*Primary Examiner*—Paula Bradley
*Assistant Examiner*—Antoine Nganajui
*Attorney, Agent, or Firm*—Stacey E. Caldwell

[57] ABSTRACT

A terminal retainer system is disclosed for an electrical connector assembly. The system includes a dielectric connector housing having a plurality of terminal-receiving passages and a retainer slot adjacent the passages. A plurality of conductive terminals are insertable in an insertion direction into the terminal-receiving passages. Each terminal includes an engaging portion. A terminal retainer is insertable into the retainer slot in a direction generally parallel to the insertion direction of the terminals to a pre-load position allowing insertion of the terminals into the passages. The terminal retainer is movable in a direction transverse to the insertion direction of the terminals from the pre-load position to a retaining position in engagement with the engaging portions of the terminals to retain the terminals in the passages.

19 Claims, 9 Drawing Sheets

ELECTRICAL CONNECTOR ASSEMBLY WITH TERMINAL RETAINER SYSTEM

FIELD OF THE INVENTION

This invention generally relates to the art of electrical connectors and, particularly, to a terminal retainer system in an electrical connector assembly.

BACKGROUND OF THE INVENTION

Generally, an electrical connector includes a dielectric housing mounting at least one electrically conductive terminal therein. The terminal is electrically connected to another circuit component, such as a discrete wire. Connectors often are employed in mateable pairs such that each terminal and the housing of one connector are mateable with a corresponding terminal and the housing of another connector.

Electrical connector assemblies are used in a wide variety of applications, such as in automotive applications, where it is necessary to electrically interconnect a plurality of electrical cables to perform various functions. The terminals of electrical connectors frequently are small components, such as components that are stamped and/or formed from thin sheet metal material. A poor quality electrical connection may occur if one or more terminals are not properly seated in its respective housing. The improper seating of a terminal in a housing may occur if the terminal is not fully inserted into the housing during the initial assembly of the connector or if the terminal is vibrated or pulled out of its fully seated condition during use of the connector. Failures of this type are of a particular concern in the automotive industry where electrical components are subjected to vibration almost continuously during normal use and are subjected to direct force during some maintenance. A pulling force on an electrical conductor secured to a terminal may cause a temporary break in the electrical contact between the terminal and another terminal of a mating connecting device.

More severe pulling forces on the terminal may cause a partial or complete disconnection. In either event, even a momentary break in the electrical connection may result in spurious operation of an electrically driven device or an electrical circuit associated with the connector.

To avoid these problems, in certain environments, such as in the automotive industry, it often is required to provide connectors with some form of a terminal position assurance (TPA) system to detect incomplete insertion of the terminals. In some environments, not only are locking means required on the connector housing for locking the terminals, but a TPA system or device also is required to perform this function. In such applications, the locking means on the housing typically is referred to as the primary lock, and the TPA device is referred to as the secondary lock. TPA devices sometimes are referred to as "terminal retainers".

In using a typical terminal retainer or TPA device, if the retainer detects that one or more terminals are not fully seated, the connector is inspected to locate the incompletely inserted terminal. In some instances, the TPA device not only detects an incompletely inserted terminal, but the device, itself, is used to move the incompletely inserted terminal to its fully inserted position. Regardless of whether the terminal retainer or TPA device is used in a "detect" system or in a "detect and correct" system, the electrical connector assemblies often are made unduly complicated to accommodate these safety components, or the connector assemblies are required to be unduly enlarged to accommodate the extra components. The present invention is directed to solving the various problems described above in a simple and efficient structural combination.

SUMMARY OF THE INVENTION

An object, therefore, of the invention is to provide a new and improved terminal retainer system in an electrical connector assembly, of the character described above.

In the exemplary embodiment of the invention, the assembly includes a dielectric connector housing having a plurality of terminal-receiving passages and a retainer slot adjacent the passages. A plurality of conductive terminals are insertable in an insertion direction into the terminal-receiving passages. Each terminal includes an engaging portion. A terminal retainer is insertable into the retainer slot in a direction generally parallel to the insertion direction of the terminals to a pre-load position allowing insertion of the terminals into the passages. The terminal retainer is movable in a direction transverse to the insertion direction of the terminals from the pre-load position to a retaining position in engagement with the engaging portions of the terminals to retain the terminals in the passages.

The assembly also includes complementary interengaging latch means between the housing and the retainer for holding the retainer in both its pre-load position and its final position. The retainer is generally planar and includes a plurality of terminal-engaging bosses spaced generally on the same pitch as the terminals. The bosses are movable from positions out-of-alignment with the engaging portions of the terminals when the retainer is in its pre-load position, to positions of engagement with the engaging portions when the retainer is in its retaining position.

As disclosed herein, the housing is a multi-component structure including at least a body part and an interengageable insert part cooperating to hold the terminal retainer in the retainer slot. Complementary interengaging cam means are provided between the terminal retainer and the insert part of the housing for biasing the retainer to its pre-load position automatically in response to interengaging the insert part with the body part of the housing. Complementary interengaging latch means are provided between the insert part of the housing and the terminal retainer for holding the retainer in its pre-load and retaining positions. The latch means on the retainer is provided on a spring for spring-loading the insert part to eliminate unnecessary play between the insert part and the body part of the housing. The spring comprises an integral molded web portion of the retainer, with the latch means being formed by a portion of the web portion.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
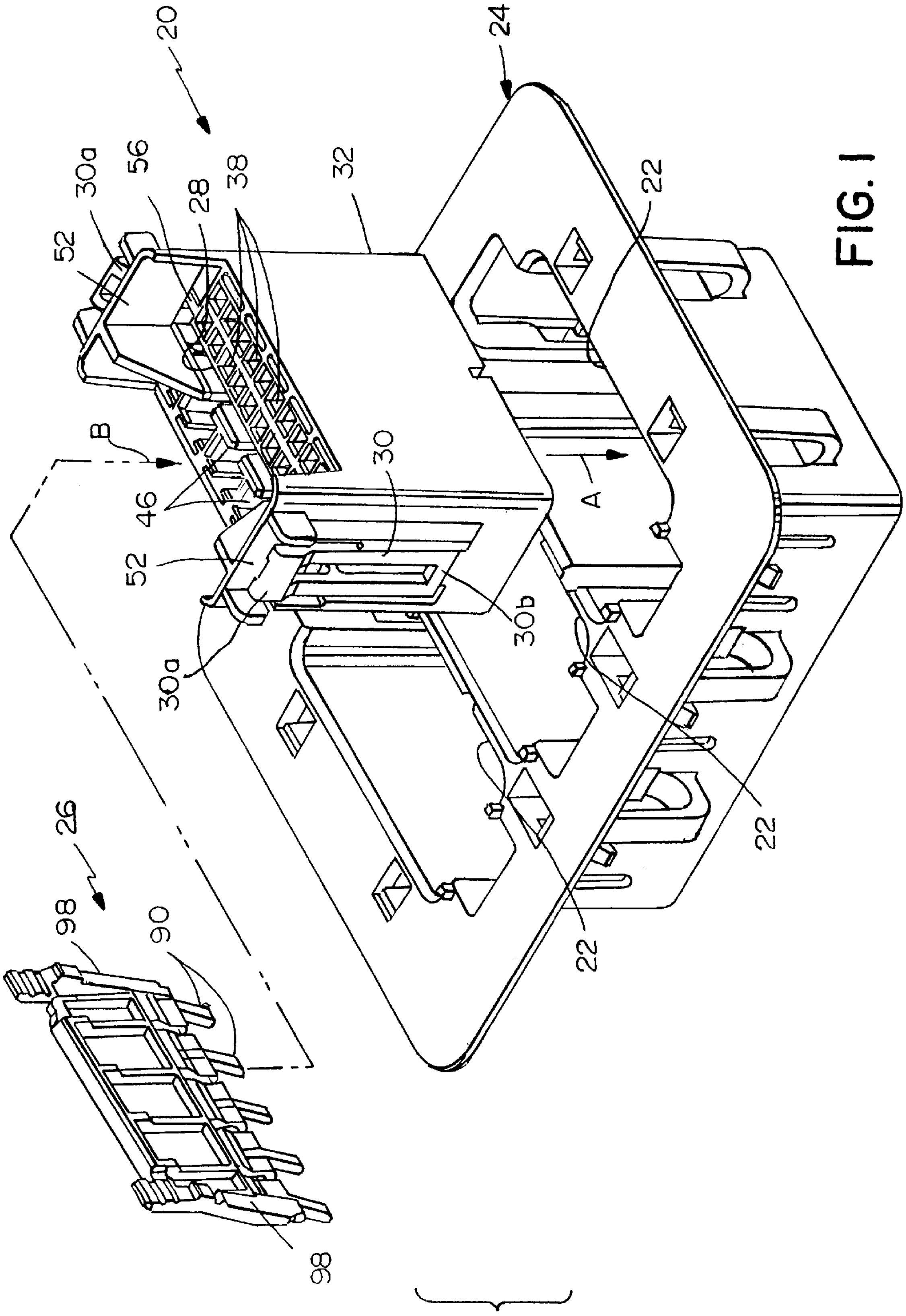
FIG. 1 is a perspective view of a connector assembly about to be inserted into a receptacle holding bracket, with the TPA device of the connector assembly pulled out of the connector housing to facilitate the illustration.

Referring to the drawings in greater detail, and first to FIG. 1, the invention is embodied in a connector assembly, generally designated 20, which is shown insertable in the direction of arrow "A" into one of a plurality of receptacles 22 of a receptacle holding bracket, generally designated 24. Although only one connector assembly 20 is shown in FIG. 1, receptacle holding bracket 24 includes three receptacles 22 for receiving three identical or similar connector assemblies 20. A TPA device, generally designated 26 and described in greater detail hereinafter, is shown insertable in the direction of arrow "B" into a TPA slot 28 in the connector assembly. The connector assembly has a pair of cantilevered latch arms 30 on opposite sides thereof for engaging appropriate latch means on receptacle holding bracket 24 to hold the connector in its respective receptacle 22.

Figure 2:
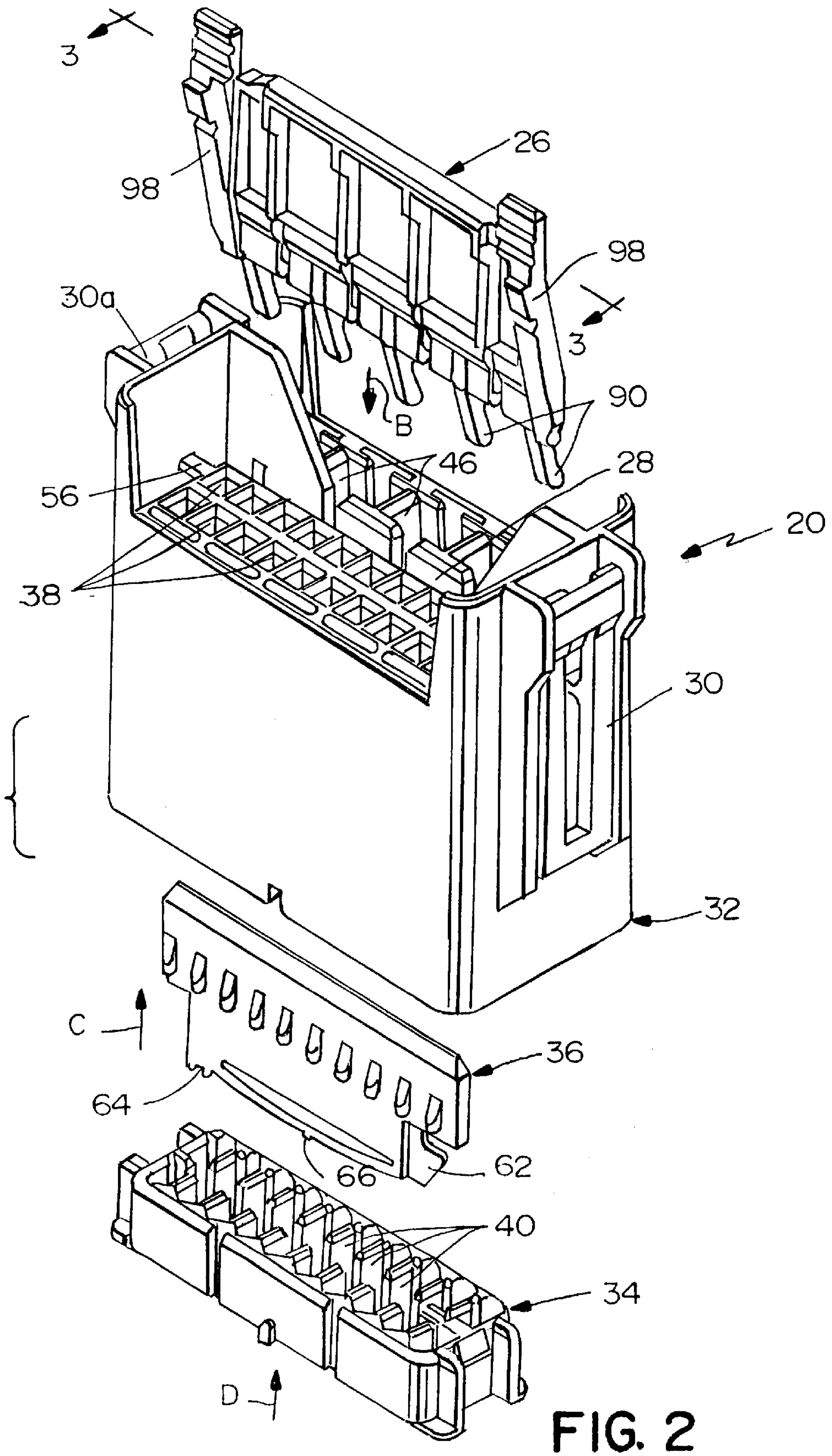
FIG. 2 is an exploded perspective view of the components of the connector assembly.
Figure 3:
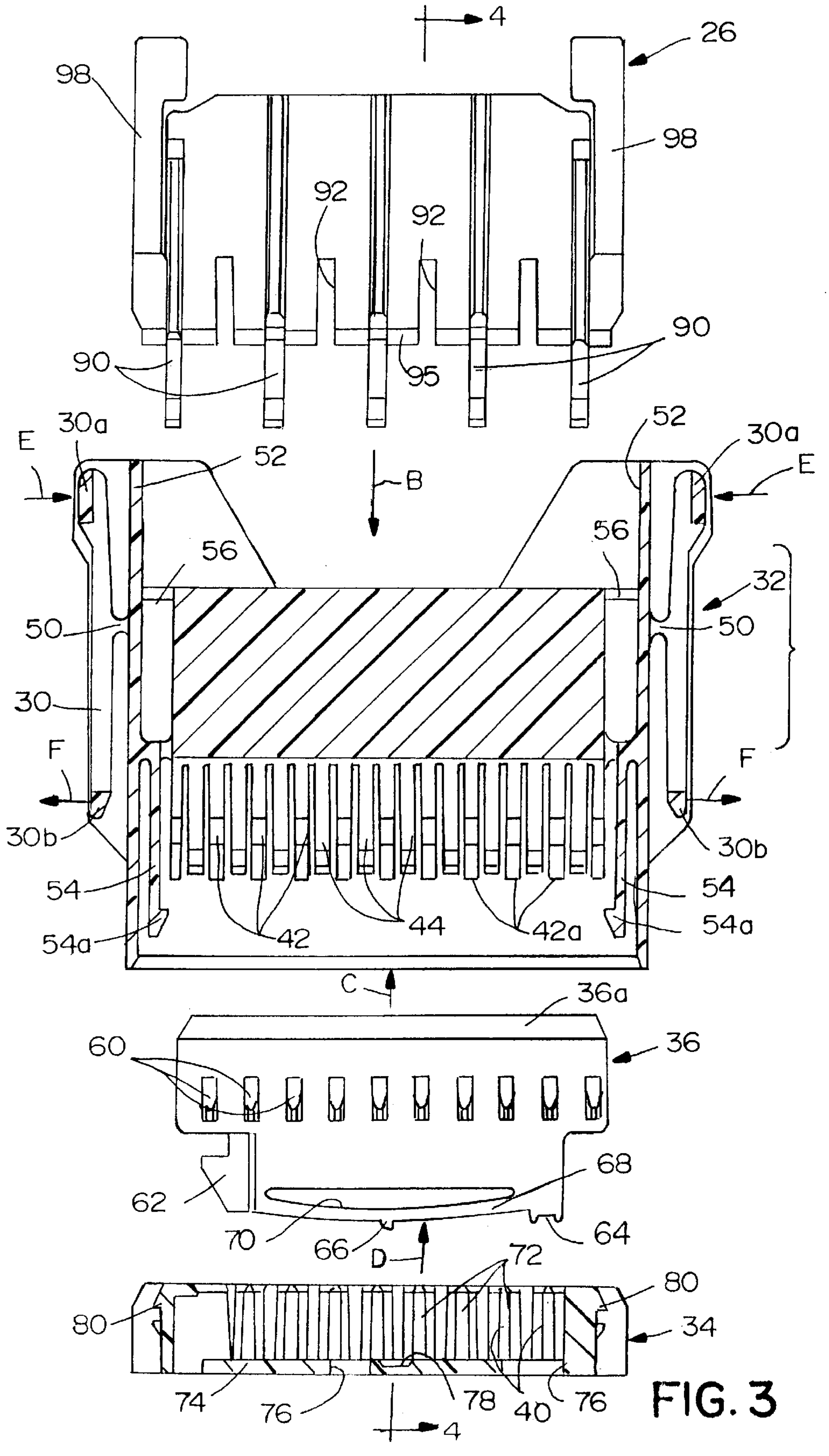
FIG. 3 is an exploded section taken generally along line 3—3 of FIG. 2.
Figure 4:
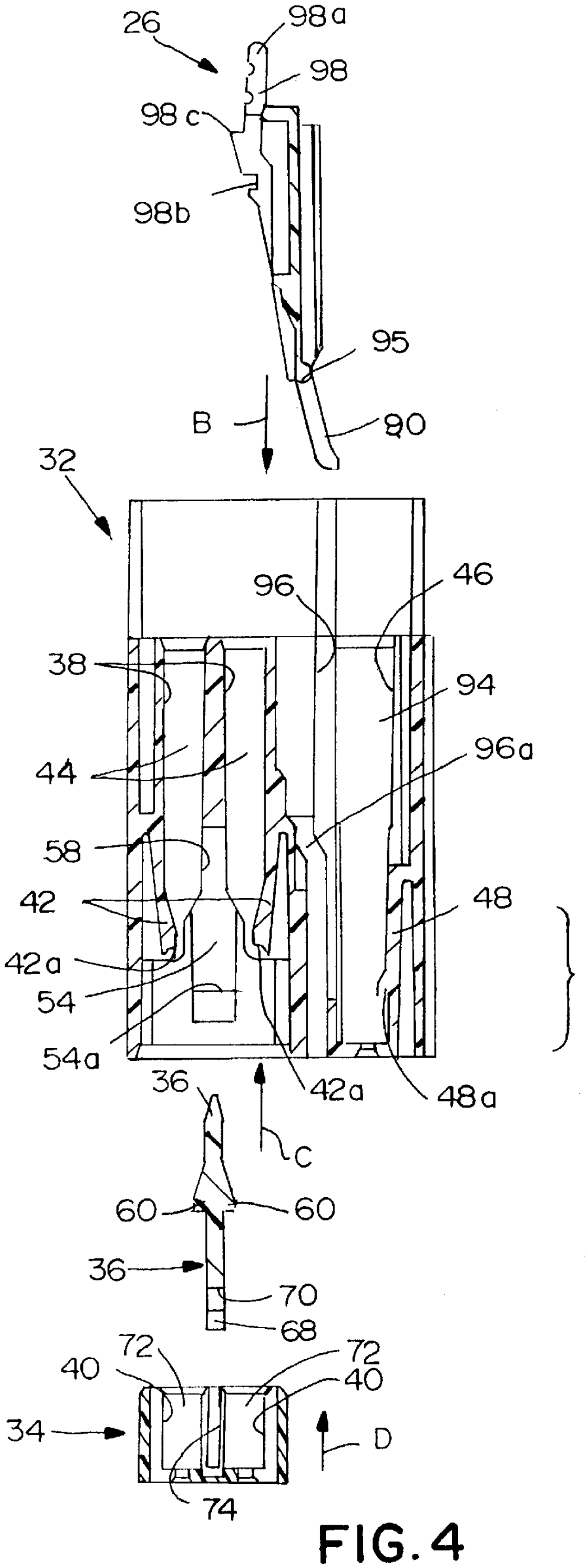
FIG. 4 is an exploded section taken generally along line 4—4 of FIG. 3.

Referring to FIGS. 2–4, electrical connector assembly 20 includes a dielectric connector housing fabricated in two parts, namely a housing body part, generally designated 32, and a housing insert, generally designated 34. In essence, TPA device 26 is insertable into slot 28 in body part 32 of the two-part housing. A slidelock or terminal retainer, generally designated 36, is insertable into the bottom of body part 32 in the direction of arrows "C", whereat insert 34 is assembled to body part 32 in the direction of arrows "D" to hold terminal retainer 36 within housing body part 32. Each of the housing parts 32 and 34 is a one-piece structure unitarily molded of dielectric material such as plastic or the like.

Housing body part 32 has a first array of two rows of terminal-receiving passages 38 as best seen in FIGS. 1, 2 and 4. Insert 34 has two rows of passages 40 which are aligned with terminal-receiving passages 38 when the insert is assembled to the body part. As best seen in FIG. 3 and 4, a flexible cantilevered latch arm 42, having a hooked distal end 42*a,* projects into each terminal-receiving passage 38. The latch arms are disposed for flexing between partitions 44 which define the side walls of terminal-receiving passages 38. In essence, latch arms 42 form a primary lock means for the terminals inserted into passages 38, and TPA device 26 provides a secondary lock means as will be described hereinafter.

Housing body part 32 further includes a second array of terminal-receiving passages 46 in a single row along the housing. As best seen in FIG. 4, a flexible latch arm 48 projects into each passage 46 and includes a latch boss 48*a* which provides a primary lock means for the terminals inserted into passages 46, while terminal retainer 36 provides a secondary lock means as described hereinafter.

FIG. 3 best shows the construction of latch arms on the outside of housing body part 32. The latch arms teeter about a living hinge 50 molded integrally with and projecting outwardly from a pair of thin side walls 52 of the body part. Inward pinching on manual ends 30*a* in the direction of arrows "E" causes latch ends 30*b* of the latch arms to open in the direction of arrows "F" to assemble and remove the body part and/or the connector assembly from its respective receptacle 22 in holding bracket 24 (FIG. 1). Body part 32 also has a pair of interior latch arms 54, with hooked latch ends 54*a* for locking insert assembly 34 within the body part. Inside latch arms 54 are cantilevered immediately inside thin side walls 52. Lastly, as best seen in FIGS. 2 and 3, a pair of latch webs 56 are molded integrally with the housing and project inwardly from side walls 52 for latching TPA device 26 in one or the other of a pre-load position and a final position, as described hereinafter.

The slidelock or terminal retainer 36 is a generally planar structure unitarily molded of dielectric material such as plastic or the like. The terminal retainer has a tapered nose 36*a* for facilitating insertion of the retainer into a retainer slot 58 (FIG. 4) in housing body part 32. A plurality of terminal-engaging bosses 60 are spaced along both sides of the terminal retainer for projecting into the two rows of terminal-receiving passages 38 in the housing body part. The bosses are spaced generally on the same pitch as the terminal-receiving passages or terminals. Therefore, the terminals can pass between bosses 60 when the terminal retainer is in its pre-load position as described hereinafter.

Terminal retainer 36 also has a biasing nose 62 projecting from one end thereof, a tool engaging notch 64 at an opposite end thereof and a projecting latch boss 66 therebetween. The latch boss projects outwardly from a web 68 molded integrally with the retainer and made flexible by an interior opening or slot 70.

Passages 40 in housing insert 34 are formed between spaced interior partitions 72. Inner edges of the partition define a slot 74 (FIG. 4) which becomes aligned with retainer slot 58 in housing body part 32 to capture terminal retainer 36 therewithin when the two housing parts are assembled. The insert has an outside wall 74 (FIG. 3) which includes a first opening 76 for alignment with tool-engaging notch 64 of terminal retainer 36, an inner latch recess 78 for receiving latch boss 66 of the terminal retainer in a pre-load position of the retainer, and a second opening 78 for receiving latch boss 66 of the terminal retainer in a final position of the retainer. Lastly, the housing insert includes a locking tab 80 at each opposite end thereof for locking engagement with hooked ends 54*a* of latch arms 54 inside side walls 52 of housing body part 32.

Figure 5:
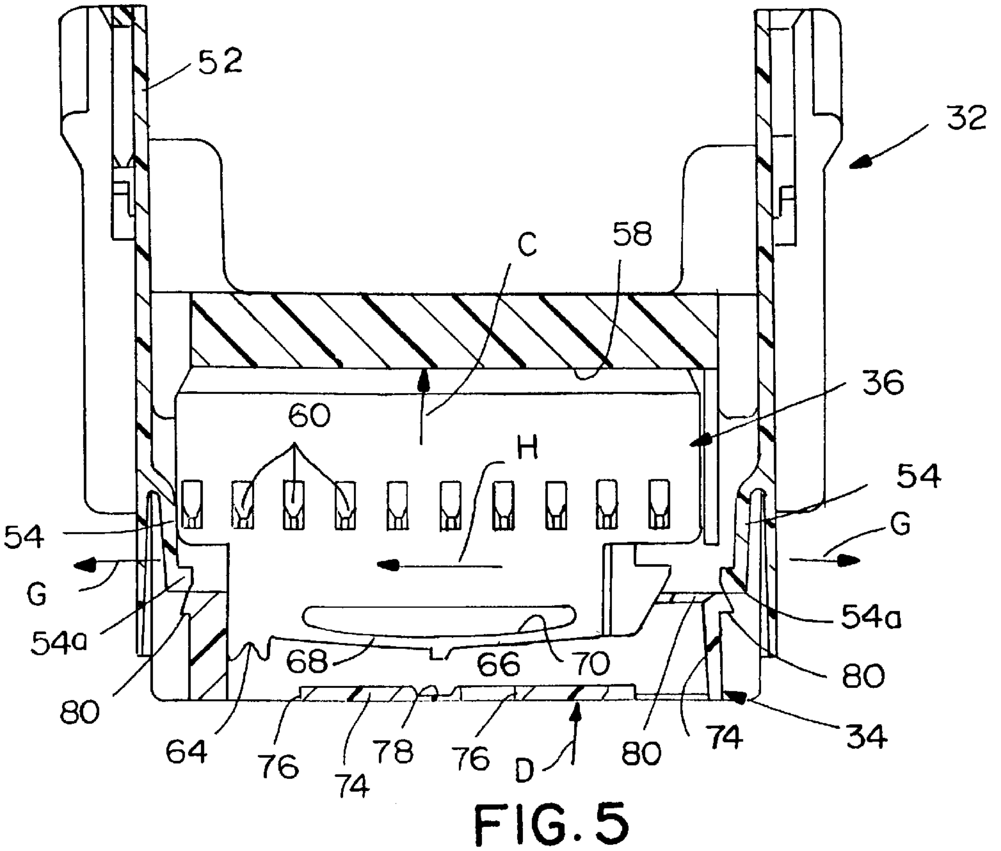
FIG. 5 is a longitudinal section through the connector assembly, with the terminal retainer fully inserted and the housing insert about to be assembled.
Figure 6:
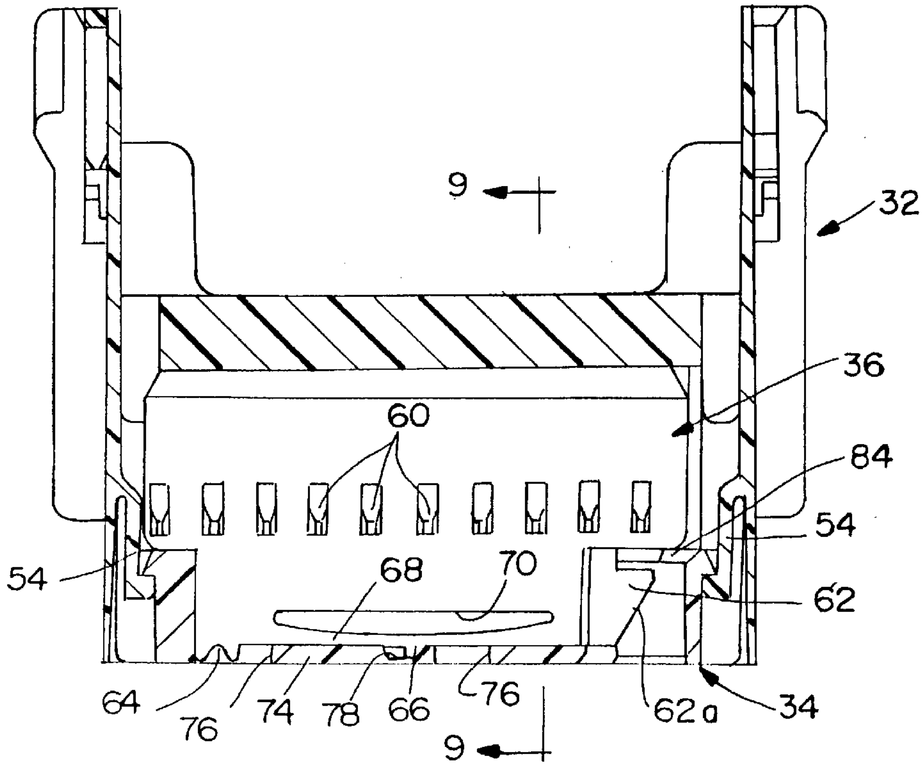
FIG. 6 is a view similar to that of FIG. 5, with the housing insert fully assembled and the terminal retainer in its pre-load position.

FIGS. 5–8 show sequential views of inserting terminal retainer 36 into retainer slot 58 in housing body part 32, and then assembling housing insert 34 to the body part and secure the terminal retainer therewithin. More particularly, FIG. 5 shows terminal retainer 36 inserted into retainer slot 58 in body part 32 in the direction of arrow "C". Insert 32 has been moved in the direction of arrow "D" until chamfered leading edges of locking tabs 80 have engaged chamfered edges of latch hooks 54*a* of latch arms 54 inside side walls 52 of body part 32. Further movement of the insert in the direction of arrow "D" will cause latch arms 54 to flex outwardly in the direction of arrows “G” until locking tabs 80 bypass latch hooks 54*a,* and the latch hooks snap back inwardly into locking engagement with tabs 80 in an assembled condition of insert 34 as shown in FIG. 6.

FIG. 6 shows insert 34 fully assembled within body part 32, and with terminal retainer 36 in its pre-load position. In the pre-load position of the retainer, latch boss 66 on the retainer is disposed within recess 78 inside wall 74 of the insert, and tool engaging notch 64 of the retainer is exposed within opening 78 of the insert.

It should be noted that biasing nose 62 of the terminal retainer has an inclined surface 62*a* which is engageable with an interior shoulder 84 within insert 34 in the event that the terminal retainer is not in its proper lateral position corresponding to the pre-load position of the retainer. In other words, when insert 34 is assembled in the direction of arrow “D” (FIG. 5), if the terminal retainer is not in its full pre-load position (i.e. completely to the left in FIGS. 5 and 6), shoulder 84 will engage inclined surface 62*a* of biasing nose 62 and slide the terminal retainer in the direction of arrow “H” (FIG. 5) to its pre-load position.

Figure 7:
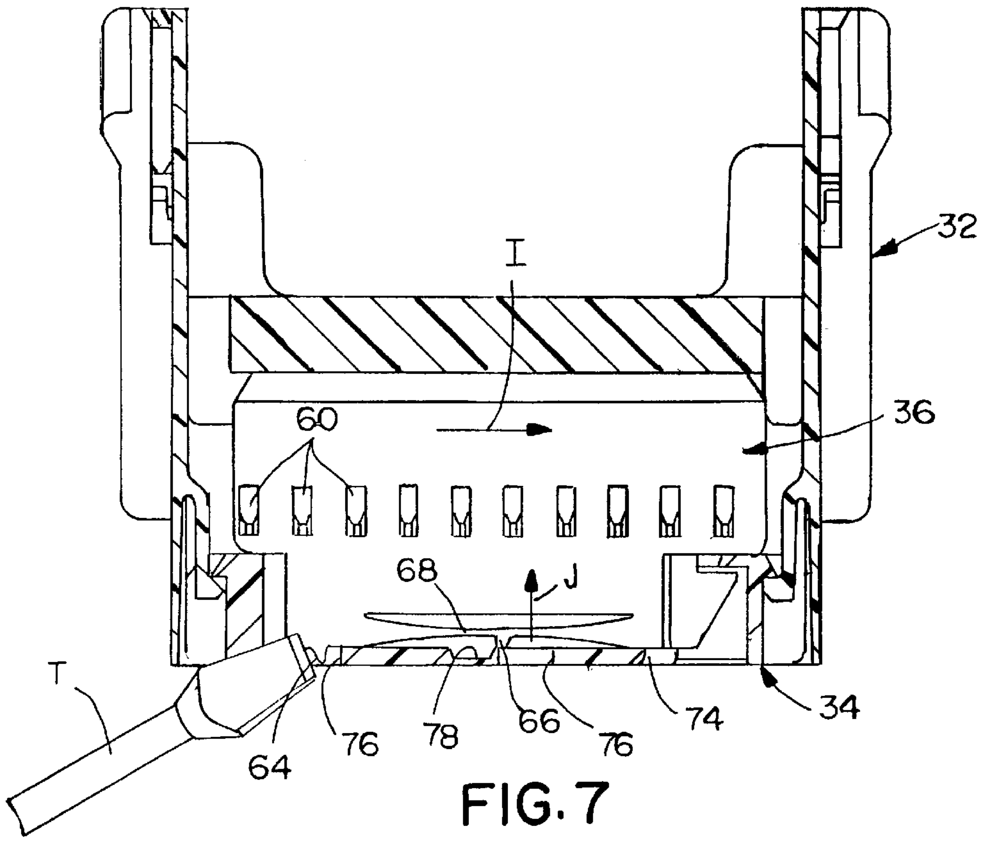
FIG. 7 is a view similar to that of FIG. 6, showing the terminal retainer being moved from its pre-load position.

FIG. 7 shows a tool “T”, such as a screwdriver, inserted through opening 78 in insert 34 and into engagement with notch 64 of terminal retainer 36. The tool is used to move the terminal retainer in the direction of arrow “I” from its pre-load position to its final terminal-locking position. During such movement as shown in FIG. 7, a chamfered leading edge of latch boss 66 engages a chamfered leading edge of recess 78 and causes the latch boss to flex with web 68 inwardly in the direction of arrow “J”.

Figure 8:
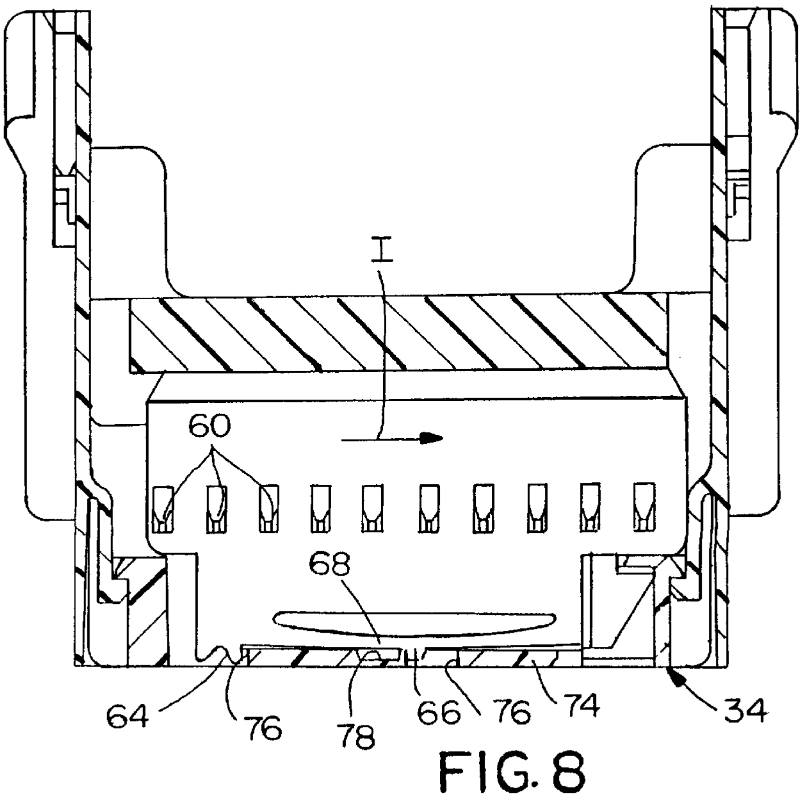
FIG. 8 is a view similar to that of FIG. 7, with the terminal retainer in its final or locked position.

Continued movement of terminal retainer 36 in the direction of arrow “I” (FIG. 7) from its pre-load position (FIG. 6) will cause latch boss 66 of the retainer to snap into opening 76 in outside wall 74 of insert 34 as seen in FIG. 8. This defines the final terminal-locking position of the slidelock or terminal retainer 36.

Figure 9:
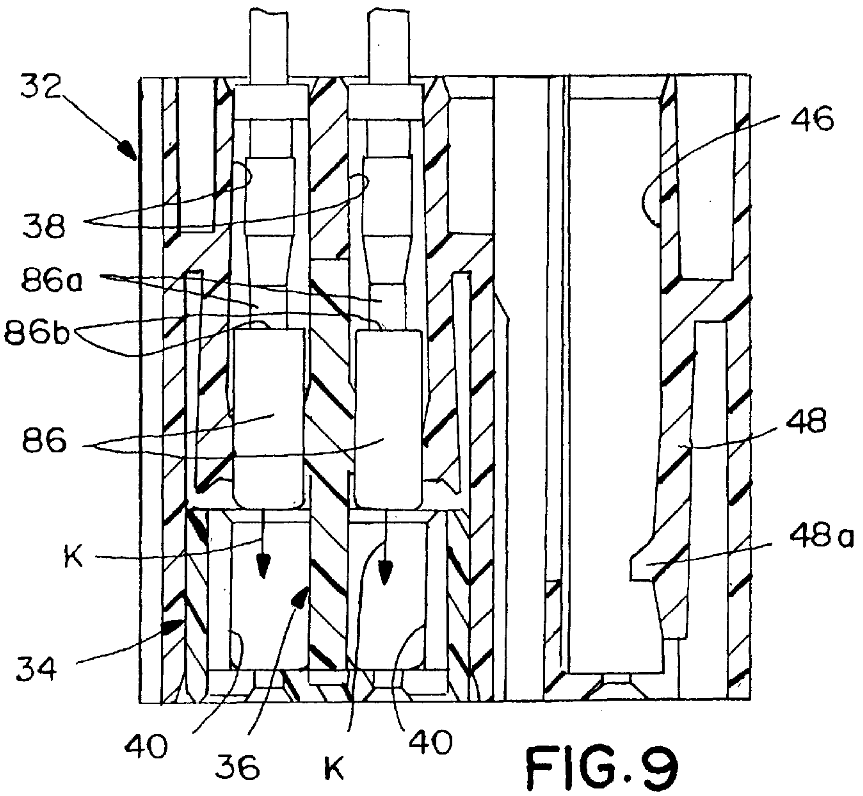
FIG. 9 is a vertical section taken generally along line 9—9 of FIG. 6, showing the terminal retainer in its pre-load position allowing the terminals to be inserted into their passages.
Figure 10:
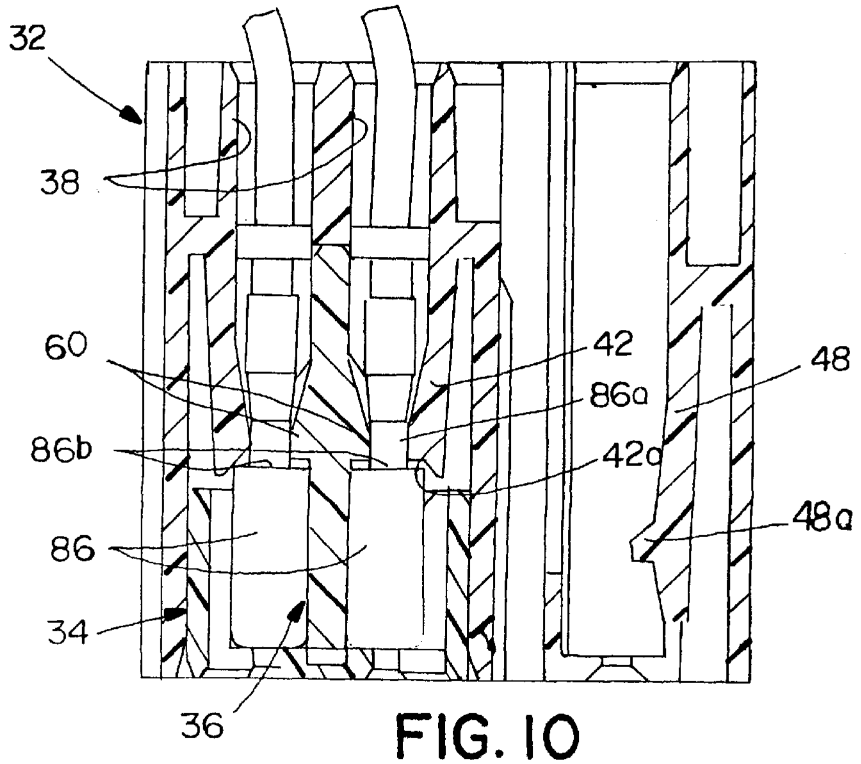
FIG. 10 is a view similar to that of FIG. 9, but with the terminal retainer in its final or locked position locking the terminals in the passages.

FIGS. 9 and 10 show the pre-load position and the final terminal-locking position, respectively, of terminal retainer 36 which is captured between housing body part 32 and housing insert 34. More particularly, FIG. 9 shows a pair of terminals 86 inserted into a pair of terminal-receiving passages 38 in body part 32, one passage in the pair being in each of the two rows of passages. The terminals are provided with recessed areas 86*a* which define locking shoulders 86*b*. With terminal retainer 36 in its pre-load position, terminals 86 are free to be inserted between terminal-engaging bosses 60 on opposite sides of the terminal retainer, in the direction of arrows “K”.

FIG. 10 shows terminals 86 in their fully inserted position. When fully inserted, hooked ends 42*a* of primary latch arms 42 lockingly engage behind shoulders 86*b* of the terminals to provide the primary locking means therefor. After the terminals are fully inserted, slidelock or terminal retainer 36 is moved in the direction of arrow “I” (FIG. 7) to its final terminal-locking position (FIG. 8). This final position is shown in FIG. 10, and it can be seen that locking bosses 60 on opposite sides of the terminal retainer now have been moved laterally into position behind shoulders 86*b* of the fully inserted terminals. In the event that one or more terminals are not fully inserted, the enlarged portion of the terminal forwardly of shoulder 86*b* will blockingly engage a respective one of the terminal-engaging bosses 60 and prevent the terminal retainer from moving to its final position. This “detects” an incomplete array of fully inserted terminals and signals an operator of such a condition.

Flexible web 68 from which latch boss 66 projects on terminal retainer 36 not only provides a spring means to afford yielding of the latch boss, but the flexible web also provides a spring for spring-loading insertion part 34 when it is assembled within housing body part 32. This spring loading eliminates unnecessary play between the insert part and the body part of the housing due to manufacturing tolerances and allows for free assembly of the components and sliding movement of terminal retainer 36. Once the connector assembly is fully assembled, insert 34 can be fixed in position, such as by ultrasonic welding.

Referring back to FIGS. 1–4, TPA device 26 is insertable into TPA slot 28 which extends along and adjacent to terminal-receiving passages 46 in housing body part 32, as described above. The TPA device is a one-piece structure unitarily molded of dielectric material such as plastic or the like. The TPA device is somewhat flat or planar and includes a plurality of fingers 90 which project forwardly when the TPA device is inserted into body part 32 in the direction of arrows “B”. In the illustrated embodiment, there are five fingers 90 corresponding to and aligned with five terminal-receiving passages 46. The planar body portion of the TPA device is slotted, as at 92 (FIG. 3) between fingers 90, to accommodate wall partitions 94 (FIG. 4) between adjacent passages 46. A leading edge 95 (FIG. 3) of the TPA device between fingers 90 is rounded as seen in FIG. 4. This rounded leading edge rides in cam slots 96 within body part 32 adjacent passages 46. The cam slots have angled cam surfaces 96*a*.

Lastly, a pair of flexible latch arms 98 are cantilevered at opposite ends of TPA device 26 at opposite ends of the array of fingers 90 (i.e. at opposite ends of the plurality of terminals disposed in passages 46). Each flexible latch arm 98 has a finger-engaging distal end 98*a,* a pre-load position notch 98*b* and a final position shoulder 98*c* as best seen in FIG. 4. Notch 98*b* and shoulder 98*c* are engageable with latch webs 56 (FIG. 3) which project inwardly from thin side walls 52 of housing body part 32. It should be noted that the cantilevered flexible latch arms 98 are flexible in a direction generally transverse to the plane of the generally planar TPA device and in the same direction that fingers 90 will move into engagement with the terminals, as described below. With this transverse flexing of the latch arms, side walls 52 of the housing body part can be made relatively thin because they do not have to be provided with extraneous latch means which would be required if the latch arms flex in a different direction, such as inwardly and outwardly generally parallel to the plane of the TPA device.

Figure 11:
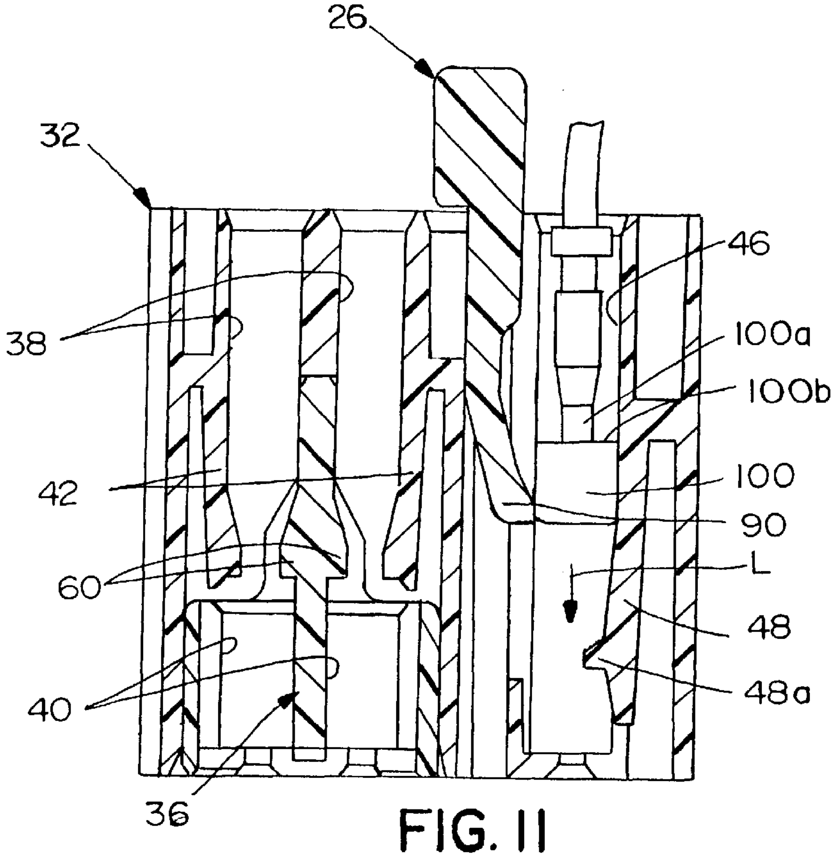
FIG. 11 is a view similar to that of FIGS. 9 and 10, with the TPA device in its pre-load position allowing insertion of the terminals past the TPA device.
Figure 12:
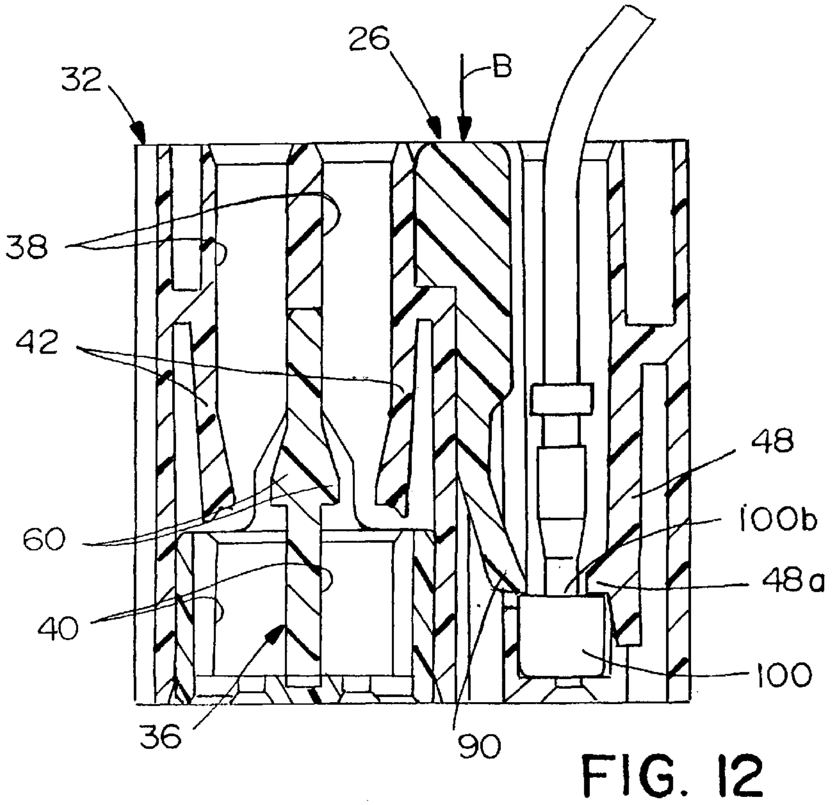
FIG. 12 is a view similar to that of FIG. 11, with the TPA device in its final position and the terminals fully inserted.

FIGS. 11 and 12 show the pre-load position and the final position, respectively, of TPA device 26 relative to housing body part 32. In the pre-load position (FIG. 11) of the TPA device, fingers 90 are disposed outside terminal-receiving passages 46. Therefore, a plurality of terminals 100 can be inserted into their respective passages in the direction of arrow “L” without any interference from the TPA device, as seen in FIG. 11. The terminals have recessed portions 100*a* defining locking shoulders 100*b*.

FIG. 12 shows one of the terminals 100 in its fully inserted position, along with TPA device 26 in its final position. It can be seen that latch boss 48*a* has engaged behind shoulder 100*b* of the terminal, and the distal end of one of the fingers 90 of TPA device 26 has also engaged behind the shoulder on the opposite side of boss 48*a*. Therefore, latch boss 48*a* defines the primary locking means within housing body part 32 for the terminal, and finger 90 of the TPA device defines a secondary locking means for the terminal.

Figure 13:
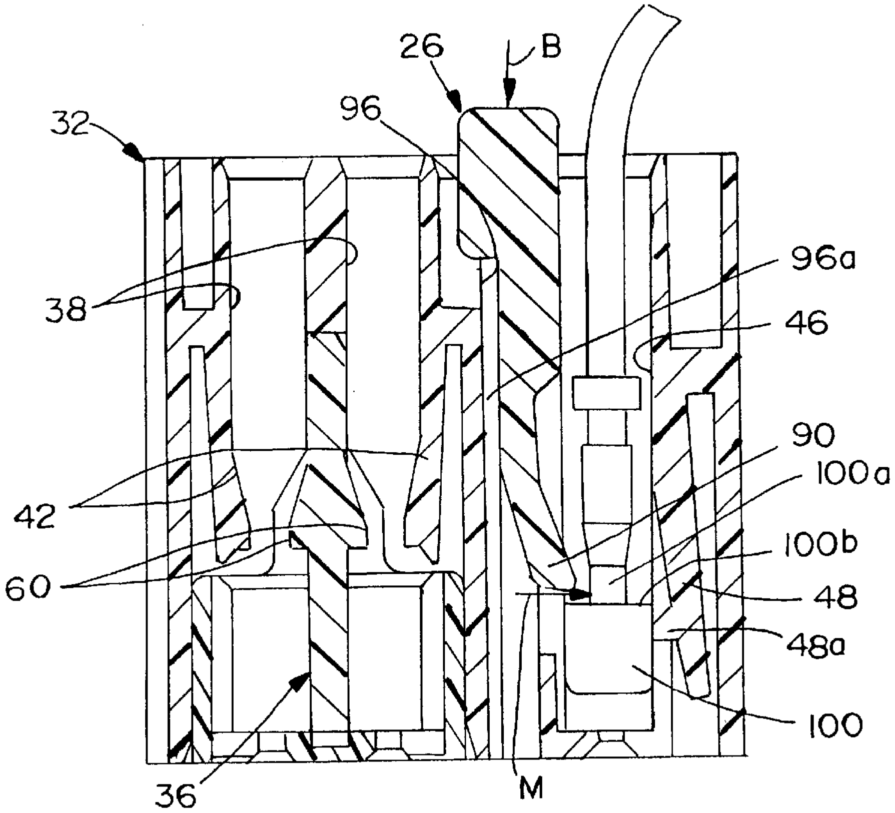
FIG. 13 is a view similar to that of FIG. 11, showing a terminal which is not fully inserted into its passage.
Figure 14:
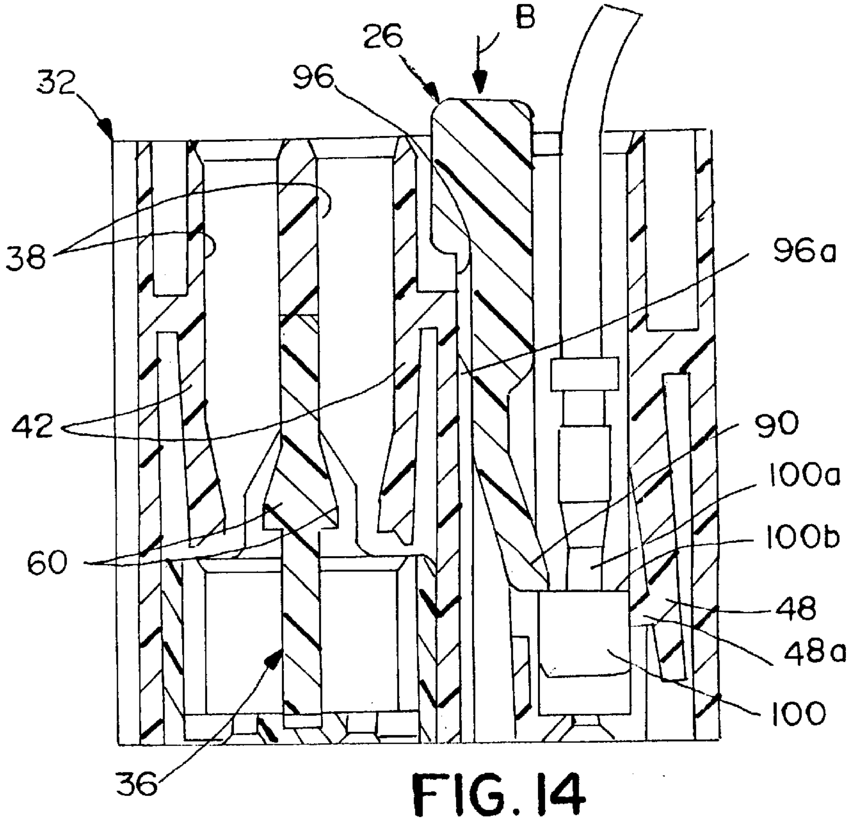
FIG. 14 is a view similar to that of FIG. 13, with the TPA device moving the terminal toward its final inserted position.

FIGS. 13 and 14 show conditions wherein one or more of the terminals 100 may not have been inserted to their full seated position, and how TPA device 26 is effective to move the terminal to its fully inserted position in a "detect and correct" manner. More particularly, terminal 100 is shown in FIG. 13 not fully seated at the bottom of its respective passage 46 in body part 32. When TPA device 26 is moved in the direction of arrow "B", rounded leading edge 94 (FIGS. 3 and 4) rides in cam slot 96 (FIG. 4) and engages cam surface 96*a* which is effective to bias finger 90 transversely into passage 46 in the direction of arrow "M". In other words, finger 90 is moved inwardly behind shoulder 100*b* of the terminal as seen in FIG. 14. Further movement of the TPA device in the direction of arrow "B" (FIG. 14) will cause both the terminal and the TPA device to move to their fully inserted positions as shown in FIG. 12 and described above.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A terminal retainer system in an electrical connector assembly, comprising:

a dielectric connector housing having a plurality of terminal-receiving passages and a retainer slot adjacent the passages;

a plurality of conductive terminals insertable in an insertion direction into the terminal-receiving passages, each terminal including an engaging portion; and a terminal retainer insertable into the retainer slot in a direction generally parallel to the insertion direction of the terminals to a pre-load position allowing insertion of the terminals into the passages, the terminal retainer being movable in a direction transverse to the insertion direction of the terminals from said pre-load position to a retaining position in engagement with the engaging portions of the terminals to retain the terminals in the passages, wherein said connector housing is a multi-component structure including at least a body part and an interengageable insert part cooperating to hold the terminal retainer in said retainer slot.

2. The terminal retainer system of claim 1, including complementary interengaging latch means between the housing and the retainer for holding the retainer in its pre-load position.

3. The terminal retainer system of claim 1, including complementary interengaging cam means between the terminal retainer and the insert part of the housing for biasing the retainer to its pre-load position automatically in response to interengaging the insert part with the body part of the housing.

4. The terminal retainer system of claim 1, including complementary interengaging latch means between the housing and the retainer for holding the retainer in its final position.

5. The terminal retainer system of claim 4, including complementary interengaging latch means between the housing and the retainer for holding the retainer in its pre-load position.

6. The terminal retainer system of claim 1, including complementary interengaging latch means between the insert part of the housing and the terminal retainer for holding the retainer in at least one of its pre-load and retaining positions.

7. The terminal retainer system of claim 6 wherein the latch means on the terminal retainer is on a spring for spring-loading the insert part for eliminating unnecessary play between the insert part and the body part of the housing.

8. The terminal retainer system of claim 7 wherein said spring is integral with the terminal retainer.

9. The terminal retainer system of claim 8 wherein said terminal retainer is molded of plastic material and said spring comprises an integrally molded web portion thereof, with the latch means being a portion of the web portion.

10. A terminal retainer system in an electrical connector assembly, comprising:

a dielectric connector housing having a plurality of terminal-receiving passages and a retainer slot adjacent the passages;

a plurality of conductive terminals insertable in an insertion direction into the terminal-receiving passages, each terminal including an engaging portion;

a terminal retainer insertable into the retainer slot and being movable from a pre-load position allowing insertion of the terminals into the passages to a retaining position in engagement with the engaging portions of the terminals to retain the terminals in the passages; and said connector housing being a multi-component structure including at least a body part and an interengaging insert part cooperating to hold the terminal retainer in said retainer slot for movement between said positions.

11. The terminal retainer system of claim 10, including complementary interengaging cam means between the terminal retainer and the insert part of the housing for biasing the retainer to its pre-load position automatically in response to interengaging the insert part with the body part of the housing.

12. The terminal retainer system of claim 10 wherein said terminal retainer is generally planar and includes a plurality of terminal-engaging bosses spaced generally on the same pitch as the terminals, the bosses being movable from positions out-of-alignment with the engaging portions of the terminals when the retainer is in its pre-load position to positions of engagement with the engaging portions of the terminals when the retainer is in its retaining position.

13. The terminal retainer system of claim 10, including complementary interengaging latch means between the insert part of the housing and the terminal retainer for holding the retainer in at least one of its pre-load and retaining positions.

14. The terminal retainer system of claim 13 wherein the latch means on the terminal retainer is on a spring for spring-loading the insert part for eliminating unnecessary play between the insert part and the body part of the housing.

15. The terminal retainer system of claim 14 wherein said spring is integral with the terminal retainer.

16. The terminal retainer system of claim 15 wherein said terminal retainer is molded of plastic material and said spring comprises an integrally molded web portion thereof, with the latch means being a portion of the web portion.

17. The terminal retainer system of claim 10, including spring means on the terminal retainer engageable with the insert part of the housing for spring-loading the insert part and eliminating unnecessary play between the insert part and the body part of the housing.

18. The terminal retainer system of claim 17 wherein said spring means is integral with the terminal retainer.

19. The terminal retainer system of claim 18 wherein said terminal retainer is molded of plastic material and said spring means comprises an integrally molded web portion thereof.

* * * * *